United States Patent

Fei et al.

(10) Patent No.: US 10,484,676 B2
(45) Date of Patent: Nov. 19, 2019

(54) CIRCUIT AND METHOD FOR ON-CHIP TESTING OF A PIXEL ARRAY

(71) Applicant: STMicroelectronics (Grenoble 2) SAS, Grenoble (FR)

(72) Inventors: Richun Fei, Grenoble (FR); Salvador Mir, Saint Hilaire du Touvet (FR); Jocelyn Moreau, Fontaine (FR)

(73) Assignee: STMicroelectronics (Grenoble 2) SA, Grenoble (FR)

( * ) Notice: Subject to any disclaimer, the term of this patent is extended or adjusted under 35 U.S.C. 154(b) by 106 days.

(21) Appl. No.: 14/887,390

(22) Filed: Oct. 20, 2015

(65) Prior Publication Data

US 2016/0112700 A1 Apr. 21, 2016

(30) Foreign Application Priority Data

Oct. 21, 2014 (FR) ..................... 14 60121

(51) Int. Cl.
| | |
|---|---|
| H04N 17/00 | (2006.01) |
| G01R 31/02 | (2006.01) |
| H01L 27/146 | (2006.01) |
| H04N 5/367 | (2011.01) |
| H04N 5/374 | (2011.01) |

(52) U.S. Cl.
CPC .......... *H04N 17/002* (2013.01); *G01R 31/02* (2013.01); *H01L 27/14643* (2013.01); *H04N 5/367* (2013.01); *G01R 31/024* (2013.01); *H04N 5/374* (2013.01)

(58) Field of Classification Search
None
See application file for complete search history.

(56) References Cited

U.S. PATENT DOCUMENTS

| | | | | |
|---|---|---|---|---|
| 4,853,789 A | * | 8/1989 | Murashima | H04N 5/23212 348/352 |
| 6,255,803 B1 | * | 7/2001 | Ishihara | G01R 31/3835 320/134 |
| 6,677,613 B1 | * | 1/2004 | Yamazaki | G02F 1/13454 257/40 |
| 7,005,884 B2 | * | 2/2006 | Gunton | H02H 7/0851 324/537 |
| 7,085,408 B1 | | 8/2006 | Chung-Chi Jim | |
| 7,145,358 B2 | * | 12/2006 | Ando | G09G 3/006 324/760.01 |

(Continued)

FOREIGN PATENT DOCUMENTS

| | | | |
|---|---|---|---|
| CN | 102063353 A | * | 5/2011 |
| CN | 102098431 A | | 6/2011 |

OTHER PUBLICATIONS

First Office Action and Search Report for co-pending CN Appl. No. 201510634790.3 dated Feb. 17, 2017 (8 pages).

(Continued)

*Primary Examiner* — Paresh H Patel

(74) *Attorney, Agent, or Firm* — Crowe & Dunlevy

(57) ABSTRACT

Testing of control wires of a pixel array of an image sensor is performed by applying a signal transition to a control wire and detecting, based on a voltage signal detected on the control wire, the duration of at least part of the signal transition on the control wire. An electrical fault in the control wire is indicated based on a comparison of the detected duration to a threshold.

22 Claims, 3 Drawing Sheets

(56) References Cited

U.S. PATENT DOCUMENTS

| | | |
|---|---|---|
| 8,736,684 B1 | 5/2014 | Johansson et al. |
| 9,137,465 B2 * | 9/2015 | Nakajima ............... H04N 5/367 |
| 9,264,703 B2 * | 2/2016 | Pahr ................... G01R 31/2829 |
| 2006/0025982 A1 * | 2/2006 | Terry .................. G06F 11/0757 |
| | | 703/19 |
| 2008/0252356 A1 * | 10/2008 | Oike ........................ G11C 7/12 |
| | | 327/374 |
| 2009/0002901 A1 * | 1/2009 | Matsumoto ...... H03K 17/08122 |
| | | 361/18 |
| 2011/0141325 A1 | 6/2011 | Nakajima |

OTHER PUBLICATIONS

Safi-Harb, Mona et al: "A CMOS Circuit for Embedded GHz Measurement of Digital Signal Rise Time Degradation," 2006 IEEE, pp. 3446-3449.

Wu, Ming-Shae et al: "Crosstalk Fault Detection for Interconnection Lines Based on Path Delay Inertia Principle," Proceedings of the 14th Asian Test Symposium (ATS '05), 2005 IEEE Computer Society (6 pages).

INPI Search Report and Written Opinion for FR 1460121 dated May 19, 2015 (7 pages).

\* cited by examiner

CIRCUIT AND METHOD FOR ON-CHIP TESTING OF A PIXEL ARRAY

PRIORITY CLAIM

This application claims the priority benefit of French Patent application number 1460121, filed on Oct. 21, 2014, the contents of which is hereby incorporated by reference in its entirety to the maximum extent allowable by law.

TECHNICAL FIELD

The present disclosure relates to a test circuit and method for on-chip testing of a pixel array, and in particular to a circuit and method for detecting electrical faults in a pixel array.

BACKGROUND

CMOS image sensors generally comprise an array of pixels interconnected by horizontal and vertical wires, the horizontal wires generally being used for control signals for controlling the pixel rows, and the vertical wires generally being used for reading out the signals from each column of pixels.

Industrial testing of such a pixel array is generally based on what is known as an optical test, which involves capturing, using the image sensor, an image of a uniform scene, and verifying that each of the pixels provides an expected reading. Such a technique permits catastrophic defects in interconnecting wires to be detected, such defects often being referred to as HFPN (Horizontal Fixed Pattern Noise) and VFPN (Vertical Fixed Pattern Noise). If any catastrophic defect is detected in a given chip, the chip may be discarded.

A problem is that some defects may not appear as catastrophic defects at the time of manufacture, because they do not induce significant image defects under limited test conditions. However, such defects may evolve into catastrophic defects under varied field conditions, and thus may lead to clear image defects during the lifetime of the image sensor. Such defects are unacceptable in certain fields of use, such as in automotive or medical applications.

There is thus a need in the art for a circuit and method for detecting non-catastrophic faults in a pixel array of an image sensor.

SUMMARY

Embodiments herein at least partially address one or more needs in the prior art.

According to one aspect, there is provided a method comprising: applying a signal transition to a control wire of a pixel array of an image sensor; detecting, based on a voltage signal detected on the control wire, the duration of at least part of the signal transition on the control wire; and detecting an electrical fault in the control wire based on the detected duration.

According to one embodiment, the electrical fault is a resistive open or resistive short in the control wire.

According to one embodiment, detecting the electrical fault comprises comparing the detected duration with a reference duration, wherein a fault is detected if the detected duration exceeds the reference duration.

According to one embodiment, detecting the duration comprises: asserting, by a first circuit, a first signal when the voltage signal on the control wire reaches a first threshold; and asserting, by a second circuit, a second signal when the voltage on the control wire reaches a second threshold.

According to a further aspect, there is provided a circuit comprising: a control circuit configured to apply a signal transition to a control wire of a pixel array of an image sensor; and a fault detection circuit coupled to the control wire and configured to: determine the duration of at least part of the signal transition on the control wire; and detect an electrical fault in the control wire based on the detected duration.

According to one embodiment, the fault detection circuit comprises: a first circuit adapted to assert a first signal when the voltage signal on the control wire reaches a first threshold; and a second circuit adapted to assert a second signal when the voltage signal on the control wire reaches a second threshold.

According to one embodiment, the first circuit comprises a low threshold inverter.

According to one embodiment, the second circuit comprises a half Schmitt trigger.

According to one embodiment, the first circuit comprises a first transistor having its control node coupled to the control wire; and the second circuit comprises second and third transistors each having its control node coupled to the control wire.

According to one embodiment, the first transistor has a width/length ratio greater than that of each of the second and third transistors.

According to one embodiment, the second circuit further comprises: a fourth transistor coupled in series with the second and third transistors; and a fifth transistor coupled by its main conducting nodes between a supply voltage and an intermediate node between the second and third transistors, a control node of the fifth transistor being coupled to an intermediate node between the second and fourth transistors.

According to one embodiment, the fourth transistor has its control node coupled to a reset signal, and the first circuit comprises a sixth transistor coupled to one of the main conducting nodes of the first transistor and having its control node coupled to the reset signal.

According to one embodiment, the reference time duration is generated by a buffer receiving the second signal.

According to a further aspect, there is provided a system comprising: a plurality of the above circuits each coupled to a corresponding one of a plurality of control wires; and a plurality of synchronous devices configured to compare the detected durations with the reference durations, wherein the synchronous devices are adapted to be daisy-chained to output the result of the comparison for each of the plurality of control wires.

According to a further aspect, there is provided a system comprising: a plurality of the above circuits each coupled to a corresponding one of a plurality of control wires; first and second bit lines; a sixth transistor coupled between the first bit line and a ground voltage and receiving at its control node the first signal for a first of the plurality of circuits; and a seventh transistor coupled between the second bit line and a ground voltage and receiving at its control node the second signal for the first of the plurality of circuits.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Figure 1:
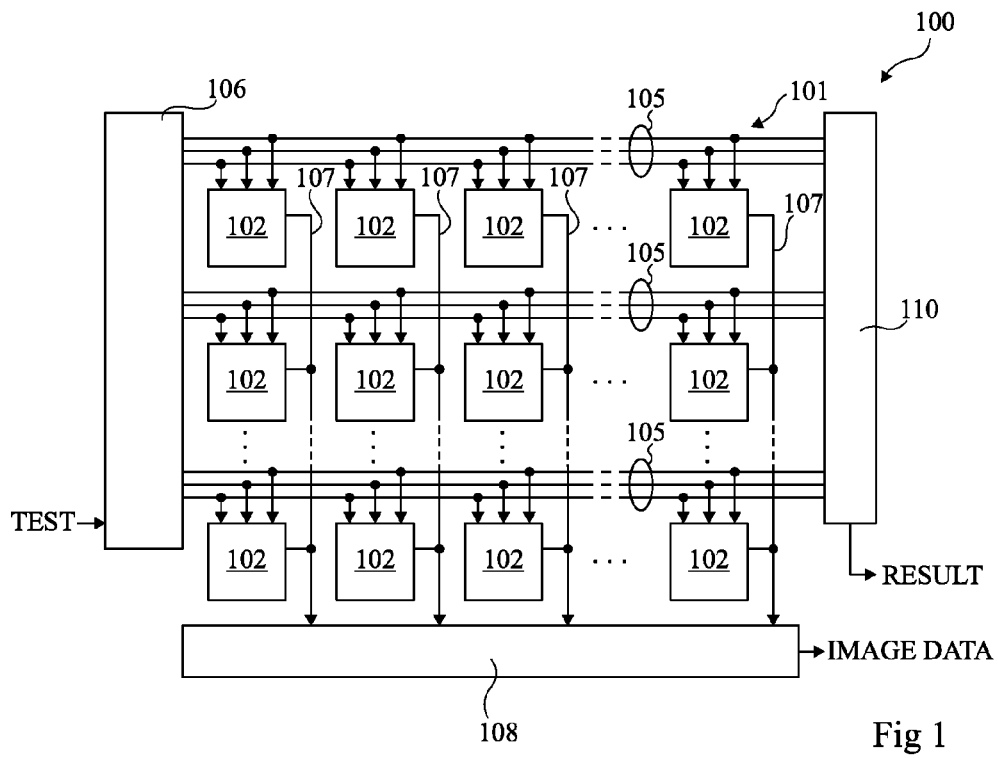
FIG. 1 schematically illustrates an image sensor according to an embodiment of the present disclosure.

FIG. 1 schematically illustrates an image sensor 100 comprising an array 101 of pixels 102, arranged in rows and columns. Three rows and four columns of pixels are represented in FIG. 1, but the pixel array 101 could be of any size. Each pixel 102 for example corresponds to a CMOS pixel, such as a 3T pixel, or other type of CMOS pixel comprising a photodiode, one or more reset transistors, and optionally a transfer gate transistor and/or source follower transistor, as will be known to those skilled in the art. However, it will also be apparent to those skilled in the art that the teaching herein could be applied to arrays of other types of pixels.

The image sensor 100 is, for example, part of an image capture device, such as a digital camera or webcam of a laptop computer, mobile telephone, smart phone, tablet computer, portable media player, or the like.

In the example of FIG. 1, the rows of pixels 102 receive one or more common control signals on one or more control wires 105. The control signals, for example, include one or more reset signals for resetting the photodiode voltage and/or the sense node voltage, a transfer gate (TG) signal, and a read signal. In the example of FIG. 1, three control wires are provided to each row of pixels in the array, although in alternative embodiments there could be any number of control wires. The control signals are, for example, generated by a row decoder 106. The row decoder 106 may receive one or more input signals (not illustrated in FIG. 1), and also for example receives a test signal TEST described in more detail below.

Each column of pixels 102 is associated with a common readout wire 107, the wires 107 providing voltage levels detected from the pixels of a selected row. The readout wires 107 are, for example, coupled to an output circuit 108 which, for example, comprises sample and hold circuits and/or one or more analog to digital converters (ADCs).

The control wires 105 are coupled to a test circuit 110 which is, for example, a BIST (Built-In Self-Test) circuit. In the example of FIG. 1, each control wire 105 has one of its extremities coupled to the row decoder 106, and its other extremity coupled to the test circuit 110. The test circuit 110, for example, provides an output signal (RESULT) indicating whether or not a fault has been detected in one or more of the control wires 105.

Operation of the test circuit 110 of FIG. 1 will now be described in more detail with reference to the flow diagram of FIG. 2A.

Figure 2A:
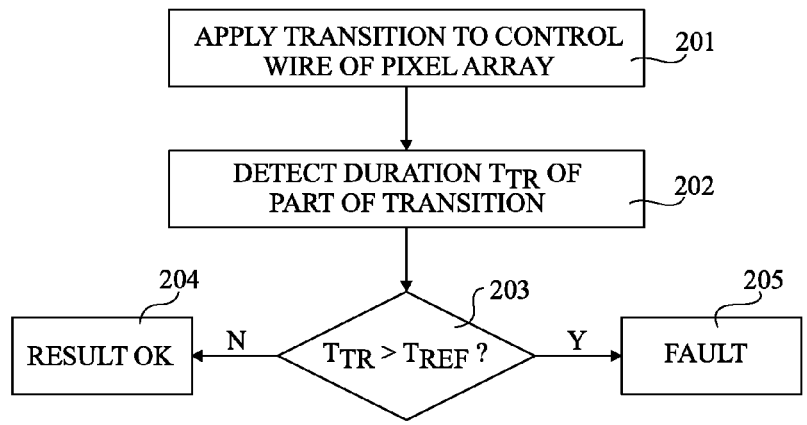
FIG. 2A is a flow diagram illustrating operations in a method of detecting electrical faults in control wires of a pixel array of an image sensor according to an embodiment of the present disclosure.

FIG. 2A illustrates an example of operations in a method of testing for electrical faults in one or more control wires of a pixel array, such as one or all of the control wires 105 of the rows of FIG. 1. The testing method for example permits resistive open (RO) or resistive short (RS) faults to be detected, as will be described in more detail below.

In a first operation 201, a signal transition is applied to one or more control wires to be tested. The signal transition is for example a rising edge, although in some embodiments a falling edge could be applied. The signal transition is, for example, generated by the row decoder 106, in response to the test signal TEST being asserted.

In a subsequent operation 202, the duration $T_{TR}$ of at least part of the transition is detected. The term "transition duration" is used herein to designate a time duration equal to the whole or part of the rise or fall time of a transition. For example, as will be described in more detail below, the time duration $T_{TR}$ is represented by a pair of signals, a first of which has a timing edge indicating the instant at which the voltage on the control wire reaches a first threshold, and the second of which has a timing edge indicating the instant at which the voltage on the control wire reaches a second threshold.

In a subsequent operation 203, the transition duration $T_{TR}$ is compared to a reference time duration $T_{REF}$. If the transition duration $T_{TR}$ is less than $T_{REF}$, the next operation is 204, in which the control wire is deemed not to contain any fault. Alternatively, if the detected transition duration $T_{TR}$ is greater than $T_{REF}$, the next operation is 205, in which it is determined that the control wire does comprise a fault. In such a case, the chip is for example discarded. In some embodiments, the comparison of operation 203 is performed on-chip, and the result is provided in operation 204 or 205 on an output pin of the chip, and/or is displayed on a display of the image capture device comprising the pixel array.

Figure 2B:
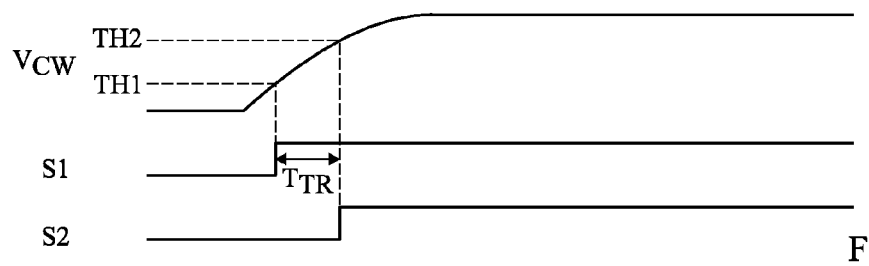
FIG. 2B is a timing diagram illustrating an example of signals in the image sensor of FIG. 1.

FIG. 2B is a timing diagram showing an example of the voltage signal $V_{CW}$ on one of the control wires 105 of FIG. 1, and of signals S1 and S2 respectively having timing edges that indicate the time instants when the signal $V_{CW}$ reaches first and second thresholds TH1 and TH2. In the example of FIG. 2B, the signal transition applied to the control wire is a rising edge, and as illustrated, the voltage $V_{CW}$ on the wire rises with a gradient that will depend on the RC value of the wire, i.e. the resistance and capacitance of the wire.

The signal S1 is initially low, and has a rising edge when the signal $V_{CW}$ reaches the threshold TH1. The signal S2 is also initially low, and has a rising edge when the signal $V_{CW}$ reaches the second threshold TH2. The time duration of the transition $T_{TR}$ is, for example, the time difference between the rising edges of the signals S1 and S2.

The present inventors have found that a resistive open or resistive short will both lead to an increase in the RC value of a wire. Indeed, a resistive open corresponds to a defect in the wire, causing a significant increase in its resistance, but without causing a full open circuit. A resistive short corresponds to partial connection between the wire and another conductor, causing a significant increase in the capacitance associated with the wire. Any increase in the RC value of the wire will cause a corresponding increase in the duration of a signal transition applied to the wire. The reference duration $T_{REF}$ is, for example, chosen as the longest reasonable transition duration on a faultless wire, and may vary from one control wire to another, depending on the intrinsic RC value of the wire.

Figure 3:
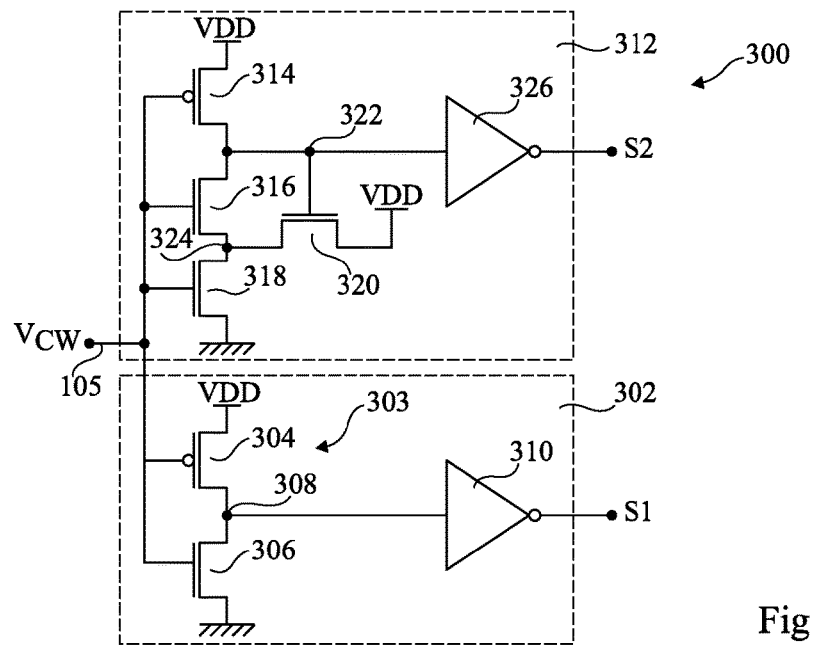
FIG. 3 schematically illustrates a circuit for detecting the duration of at least part of a signal transition according to an embodiment of the present disclosure.

FIG. 3 schematically illustrates a transition duration detection circuit 300 for generating the signals S1 and S2 of FIG. 2B based on a signal transition applied to one of the control wires 105.

The circuit 300 comprises a circuit 302 for generating the signal S1, comprising a low threshold inverter 303 formed of a pair of transistors 304, 306 coupled in series via their main conducting nodes between a supply voltage VDD and ground, and having their control nodes coupled in the control line 105. The transistor 304 is for example a p-channel MOS (PMOS) transistor having its source coupled to the supply voltage VDD, and the transistor 306 is for example an n-channel MOS (NMOS) transistor having its source coupled to ground. An intermediate node 308 between the transistors 304, 306 is, for example, coupled to the input of a further inverter 310, which provides the signal S1 at its output. The NMOS transistor 306 of the low threshold invertor 303, for example, has a width/length ratio that is greater than that of the PMOS transistor 304, and as such the transistor 306 has a relatively low threshold voltage, and the node 308 is, for example, pulled low by a relatively low level of the voltage signal $V_{CW}$.

The circuit 300 also comprises a circuit 312 for generating the signal S2, comprising a half Schmitt trigger. For example, the circuit 312 comprises three transistors 314, 316 and 318 coupled in series with each other via their main conducting nodes between the supply voltage VDD and ground, and each having its control node coupled to the control wire 105. The transistor 314 is for example a PMOS transistor having its source coupled to the supply voltage VDD, and the transistors 316, 318 are, for example, NMOS transistors, transistor 318 having its source coupled to ground. A further transistor 320, which is for example an NMOS transistor, has its control node coupled to an intermediate node 322 between the transistors 314 and 316, and its main conducting nodes coupled between the supply voltage VDD and an intermediate node 324 between the transistors 316 and 318. The node 322 is also coupled to an input of an inverter 326, which provides the signal S2 at its output.

In operation, the low threshold inverter 302 will be activated directly when the voltage signal $V_{CW}$ on line 105 reaches a voltage level that is high enough to turn ON the NMOS transistor 306. The half Schmitt trigger of circuit 312 will, however, only be activated when the voltage signal $V_{CW}$ has reached a sufficient level to turn ON both of the NMOS transistors 316 and 318, such that the NMOS transistor 320 is turned OFF. Thus, the trigger threshold TH2 of the circuit 312 is relatively high with respect to the trigger threshold TH1 of the low threshold inverter 302. The trigger threshold TH2 is dependent on the width/length ratios of the transistors 318 and 320. In particular, calling the width/length ratio of the transistor 318 "K1", the threshold voltage of transistor 318 "$V_{th1}$", and the width/length ratio of the transistor 320 "K2", the ratio K1/K2 for example has the follow relation to the trigger threshold TH2:

$$\frac{K_1}{K_2} = \frac{(VDD - TH2)^2}{(TH2 - V_{th1})^2}$$

Figure 4:
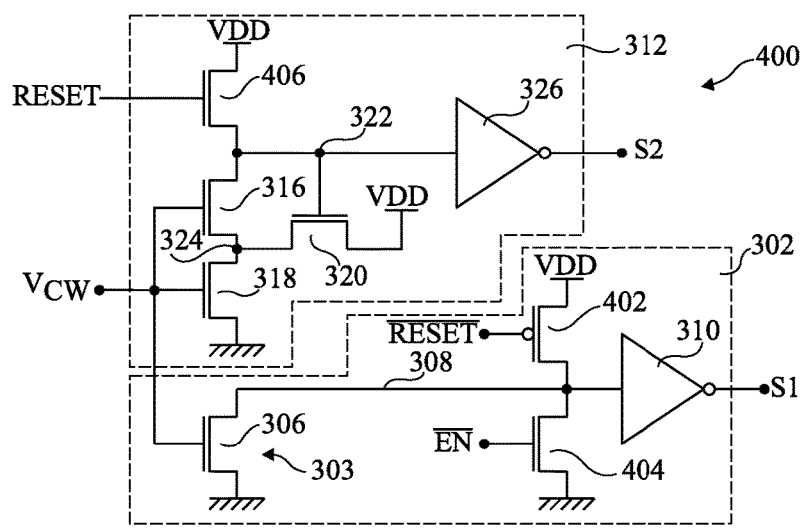
FIG. 4 schematically illustrates a circuit for detecting the duration of at least part of a signal transition according to a further embodiment of the present disclosure.

FIG. 4 illustrates a transition duration detection circuit 400 for generating the signals S1 and S2 of FIG. 2B according to an alternative embodiment to that of FIG. 3. The circuit has many components in common with the circuit 300 of FIG. 3, and these have been labeled with like reference numerals in FIG. 4 and will not be described again in detail.

The embodiment of FIG. 4 uses only NMOS transistors in the low threshold inverter 303 and half Schmitt trigger 312.

In the circuit 302, the PMOS transistor 304 is removed, and a PMOS transistor 402 is added, coupled by its main conducting nodes between the node 308 and the supply voltage VDD. An NMOS transistor 404 is also added, coupled by its main conducting nodes between the node 308 and ground. The transistor 402 is controlled by the inverse $\overline{RESET}$ of a reset signal, such that when the reset signal is asserted high, the transistor 402 is activated and the node 308 is coupled to the supply voltage VDD. The transistor 404 is controlled by the inverse $\overline{EN}$ of an enable signal, such that when the enable signal is asserted high, the transistor 404 is OFF. The NMOS transistor 306 of the low threshold inverter for example has a width/length ratio that is greater than that of the NMOS transistor 318 of the circuit 312.

In the circuit 312, the PMOS transistor 314 is replaced by an NMOS transistor 406 coupled via its main conducting nodes between the node 322 and the supply voltage VDD, and controlled by the reset signal RESET.

Operation of the circuit of FIG. 4 will now be described in more detail with reference to FIG. 5.

Figure 5:
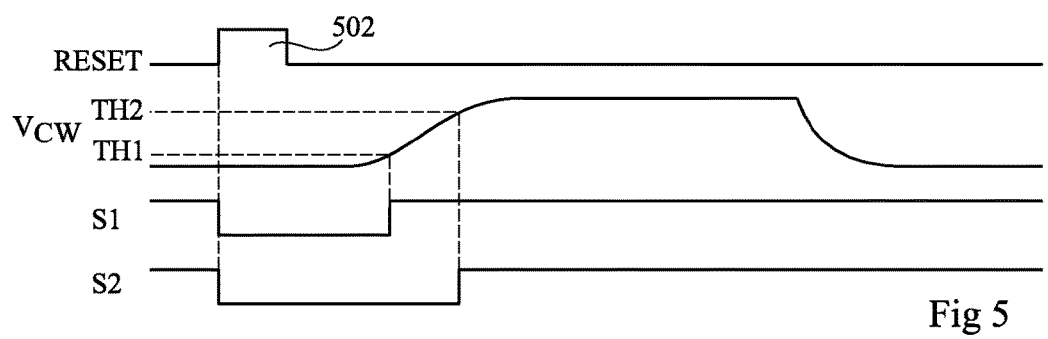
FIG. 5 is a timing diagram illustrating an example of signals in the circuit of FIG. 4.

FIG. 5 is a timing diagram showing examples of the signals RESET, $V_{CW}$, S1 and S2 in the circuit of FIG. 4. As illustrated, the reset signal RESET for example comprises a high pulse 502 causing the signals S1 and S2 to be reset to a low level prior to the start of the transition on the control wire. The signals S1 and S2 are otherwise the same as in the example of FIG. 2B, and will not be described again in detail.

Figure 6:
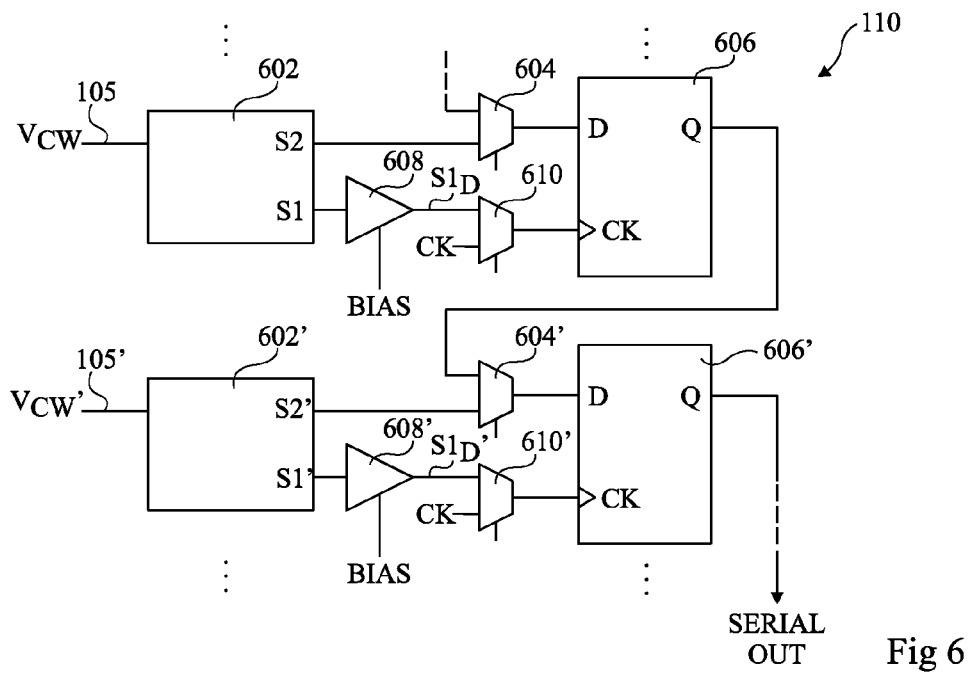
FIG. 6 schematically illustrates a fault detection circuit according to an embodiment of the present disclosure.

FIG. 6 schematically illustrates the test circuit 110 of FIG. 1 in more detail according to an example embodiment. The circuitry associated with two control wires 105 and 105' is represented, but could be extended to any number of control wires to be tested.

For the control wire 105, a transition duration detection circuit 602 is provided, generating the signals S1 and S2. The circuit 602 is, for example, implemented by the circuit 300 of FIG. 3 or 400 of FIG. 4. The signal S2 is provided to one input of a 2-input multiplexer 604 having its output coupled to a data input D of a flip-flop 606. The signal S1 is coupled by a buffer 608 to one input of a 2-input multiplexer 610, the other input of which receives a clock signal CK, and the output of which is coupled to the clock input of the flip-flop 606. The buffer 608 introduces the delay $T_{REF}$ to generate a delayed version $S1_D$ of the signal S1. The delay is, for example, controllable by a bias voltage BIAS provided to the buffer.

A similar circuit is, for example, provided for the control wire 105', of which the elements are labeled with like reference numerals followed by an apostrophe, and for all of the control wires to be tested.

To read the results stored by the flip-flops 606, 606', the flip-flops are, for example, daisy-chained, and thus the Q output of the flip-flop 606 is, for example, coupled to a second input of the multiplexer 604', and similarly, the second input of the multiplexer 604 is, for example, coupled to the Q output of a flip-flop of a previous wire. The final flip-flop of the chain, for example the flip-flop 606' in the example of FIG. 6, provides the serial output data (SERIAL OUT).

Operation of the circuit of FIG. 6 will now be described in more detail with reference to FIG. 7.

Figure 7:
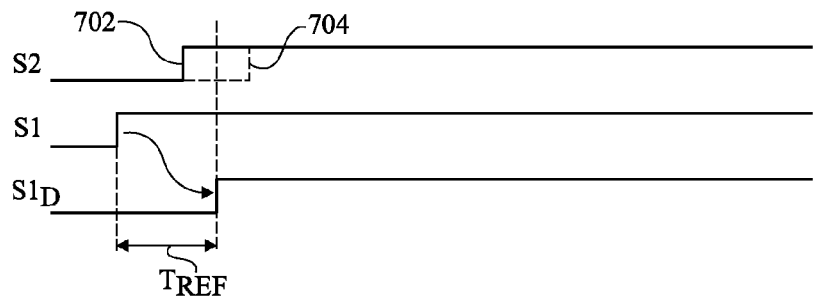
FIG. 7 is a timing diagram illustrating examples of signals in the circuit of FIG. 6.

FIG. 7 is a timing diagram illustrating the signals S2, S1 and the delayed signal S1$_D$.

During the detection phase, the multiplexers 604 and 610 associated with each control wire are respectively controlled to select the signals S2 and S1$_D$ at their inputs.

The rising edge of the signal S1 is delayed by the buffer 608 by the reference time duration T$_{REF}$. If the transition duration is relatively short, the rising edge of the signal S2 will be asserted before the delayed rising edge of the signal S1$_D$, as shown by an example edge 702 in FIG. 7. Therefore, the clock input of the flip-flop 606 will be asserted after the signal S2 goes high, and the Q output of the flip-flop 606 will also go high upon the rising edge of the signal S1$_D$. Alternatively, if the transition duration is relatively long, the rising edge of the signal S2 will be asserted after the delayed rising edge of the signal S1, as shown by an example edge 704 in FIG. 7. Thus, the Q output of the flip-flop will remain low upon the rising edge of the signal S1$_D$.

During a readout phase, the flip-flops 606, 606' etc. are daisy-chained using the multiplexers 604, 604' etc., and the multiplexers 610, 610', etc. are controlled to select the clock input CK, such that the result from each flip-flop generates a serial output SERIAL OUT. If the signal SERIAL OUT has any low period, this indicates a fault in the corresponding control wire.

Figure 8:
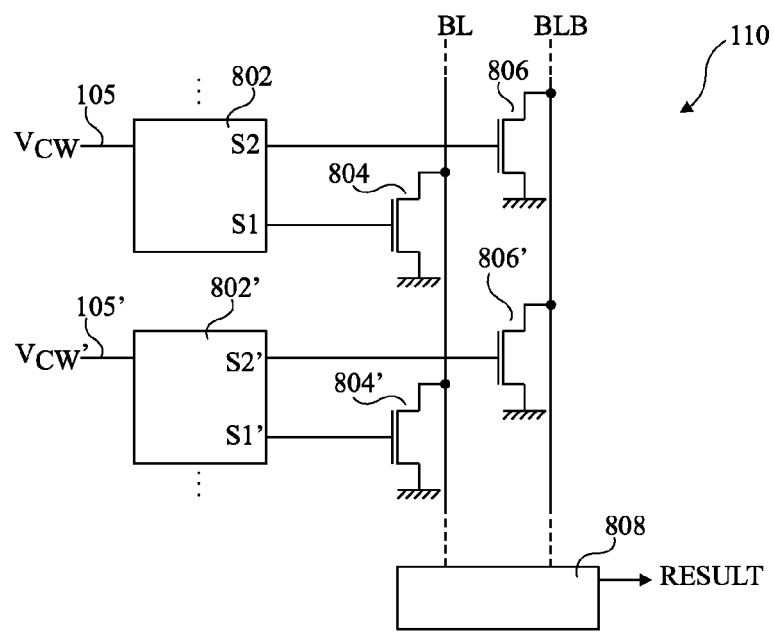
FIG. 8 schematically illustrates a fault detection circuit according to a further embodiment of the present disclosure.

FIG. 8 schematically illustrates the test circuit 110 of FIG. 1 in more detail according to an alternative embodiment to that of FIG. 6, in which the signals S1 and S2 are provided one by one over a pair of bit lines, and the transition durations are compared with the reference time duration T$_{REF}$ by a common circuit.

The signals S1 and S2 for the control wire 105 are provided by a corresponding transition duration detection circuit 802, which is for example implemented by the circuit 300 of FIG. 3 or 400 of FIG. 4. The signal S1 is provided on a line to the control node of a transistor 804, which is for example an NMOS transistor. Transistor 804 is coupled via its main conducting nodes between a bit line BL and ground. Similarly, the signal S2 is provided on a line to the control node of a transistor 806, which is also for example an NMOS transistor. The transistor 806 is coupled via its main conducting nodes between a bit line BLB and ground. Similar circuitry is provided for the control wire 105', the elements of which are labeled with like reference numerals followed by an apostrophe, and for each other control wire to be tested.

The bit lines BL and BLB are coupled to a fault detection circuit 808, for example positioned at the bottom of the array. The signal transitions applied to the control wires are, for example, time-shifted with respect to each other, such that not more than one of the S1 signals and not more than one of the S2 signals will be asserted at the same time on the bit line BL or BLB. The circuit 808 for example comprises circuitry similar to the buffer 608 and flip-flop 606 of FIG. 6 for comparing the duration of each transition with the reference duration T$_{REF}$ to provide an output signal (RESULT).

An advantage of the embodiments described herein is that electrical faults in control wires of an image sensor can be detected even when such faults do not result in an immediate catastrophic failure of the wire.

Having thus described at least one illustrative embodiment, various alterations, modifications and improvements will readily occur to those skilled in the art.

For example, it will be apparent to those skilled in the art that the various transistors that are described as being NMOS transistors could be implemented as PMOS transistors, and vice versa. Furthermore, while the various embodiments have been described in relation to MOS technology, it will be apparent to those skilled in the art that other transistor technologies could be used, such as bipolar technology.

Furthermore, it will be apparent to those skilled in the art that the ground voltage described herein may be at 0 V, or more generally at any supply voltage V$_{SS}$, that could be different from 0 V, and that the ground and supply voltages could be exchanged.

Furthermore, the features described in relation to the various embodiments could be combined in alternative embodiments in any combination.

The invention claimed is:

1. A method, comprising:
    applying a signal to a control wire connected to control inputs of a plurality of pixels in a row of a pixel array of an image sensor;
    detecting, based on a change of a voltage of the applied signal on the control wire, a transition period of time over which the voltage of said applied signal on the control wire changes from a first threshold voltage to a second threshold voltage; and
    detecting an electrical fault in the control wire if the detected transition period of time exceeds a reference period of time.

2. The method of claim 1, wherein the electrical fault is one of a resistive open and resistive short in the control wire.

3. The method of claim 1, wherein detecting the electrical fault comprises comparing the detected transition period of time with the reference period of time.

4. The method of claim 1, wherein detecting the transition period of time comprises:
    asserting, by a first circuit, a first signal when the change in the voltage of the applied signal on the control wire reaches said first voltage threshold;
    asserting, by a second circuit, a second signal when the change in the voltage of the applied signal on the control wire reaches said second voltage threshold; and
    wherein the transition period of time is a difference in time between assertion of the first and second signals.

5. A circuit, comprising:
    a control circuit configured to apply a signal to a control wire connected to control inputs of a plurality of pixels in a row of a pixel array of an image sensor; and
    a fault detection circuit coupled to the control wire and configured to:
        determine based on a change in voltage of the applied signal on the control wire a transition period of time over which the voltage of said applied signal on the control wire changes from a first threshold voltage to a second threshold voltage; and
        detect an electrical fault in the control wire if the determined transition period of time exceeds a reference period of time.

6. The circuit of claim 5, wherein the fault detection circuit comprises:
    a first circuit configured to assert a first signal when the change in the voltage of the applied signal on the control wire reaches said first voltage threshold; and
    a second circuit configured to assert a second signal when the change in the voltage of the applied signal on the control wire reaches said second voltage threshold;
    wherein the transition period of time is a time difference between assertion of the first and second signals.

7. The circuit of claim 6, wherein the first circuit comprises a low threshold inverter having an input coupled to the control wire.

8. The circuit of claim 6, wherein the second circuit comprises a half Schmitt trigger having an input coupled to the control wire.

9. The circuit of claim 6, wherein:
the first circuit comprises a first transistor having its control node coupled to the control wire; and
the second circuit comprises second and third transistors each having its control node coupled to the control wire.

10. The circuit of claim 9, wherein the first transistor has a width/length ratio greater than that of each of the second and third transistors.

11. The circuit of claim 9, wherein the second circuit further comprises:
a fourth transistor coupled in series with the second and third transistors; and
a fifth transistor coupled by its main conducting nodes between a supply voltage node and an intermediate node between the second and third transistors, a control node of the fifth transistor being coupled to an intermediate node between the second and fourth transistors.

12. The circuit of claim 11, wherein the fourth transistor has its control node coupled to a reset signal, and wherein the first circuit comprises a sixth transistor coupled to one of the main conducting nodes of the first transistor and having its control node coupled to the reset signal.

13. The circuit of claim 5, wherein the reference period of time is generated by a buffer receiving the second signal.

14. A system, comprising:
a plurality of testing circuits, each testing circuit coupled to a corresponding one of a plurality of control wires, wherein each testing circuit comprises:
a control circuit configured to apply a signal to a control wire connected to control inputs of a plurality of pixels in a row of a pixel array of an image sensor; and
a fault detection circuit coupled to the control wire and configured to:
determine based on a change in voltage of the applied signal on the control wire a time duration over which the voltage of said applied signal on the control wire changes from a first threshold voltage to a second threshold voltage; and
detect an electrical fault in the control wire if the determined time duration exceeds a reference time duration; and
a plurality of synchronous devices configured to store information indicating the detected electrical fault, wherein the synchronous devices are daisy-chained together for serial output of the stored information for each of the plurality of control wires.

15. The system of claim 14, wherein each fault detection circuit comprises:

a first circuit configured to assert a first signal when the change in the voltage of the applied signal on the control wire reaches said first voltage threshold; and
a second circuit configured to assert a second signal when the change in the voltage of the applied signal on the control wire reaches said second voltage threshold;
wherein the time duration is a time difference between assertion of the first and second signals.

16. The system of claim 15, further comprising:
first and second bit lines;
a first transistor coupled between the first bit line and a ground voltage node and receiving at its control node the first signal output from the fault detection circuit of a first testing circuit of said plurality of testing circuits; and
a second transistor coupled between the second bit line and the ground voltage node and receiving at its control node the second signal output from the fault detection circuit of the first testing circuit of said plurality of testing circuits.

17. The system of claim 16, further comprising:
a third transistor coupled between the first bit line and the ground voltage node and receiving at its control node the first signal output from the fault detection circuit of a second testing circuit of said plurality of testing circuits; and
a fourth transistor coupled between the second bit line and the ground voltage node and receiving at its control node the second signal output from the fault detection circuit of the second testing circuit of said plurality of testing circuits.

18. The system of claim 15, wherein:
the first circuit comprises a first test transistor having its control node coupled to the control wire; and
the second circuit comprises second and third test transistors each having its control node coupled to the control wire.

19. The system of claim 18, wherein the first test transistor has a width/length ratio greater than that of each of the second and third test transistors.

20. The system of claim 18, wherein the second circuit further comprises:
a fourth test transistor coupled in series with the second and third test transistors; and
a fifth test transistor coupled by its main conducting nodes between a supply voltage node and an intermediate node between the second and third test transistors, a control node of the fifth test transistor being coupled to an intermediate node between the second and fourth test transistors.

21. The system of claim 20, wherein the fourth test transistor has its control node coupled to a reset signal, and wherein the first circuit comprises a sixth test transistor coupled to one of the main conducting nodes of the first test transistor and having its control node coupled to the reset signal.

22. The system of claim 14, wherein the reference time duration is generated by a buffer receiving the second signal.

* * * * *